United States Patent [19]

Brennan et al.

[11] Patent Number: 4,980,202

[45] Date of Patent: Dec. 25, 1990

[54] CVD SIC MATRIX COMPOSITES CONTAINING CARBON COATED FIBERS

[75] Inventors: John J. Brennan, Portland; Francis S. Galasso, Manchester; Richard D. Veltri, East Hartford; David A. Condit, Avon, all of Conn.

[73] Assignee: United Technologies Corporation, Hartford, Conn.

[21] Appl. No.: 375,164

[22] Filed: Jul. 3, 1989

[51] Int. Cl.[5] ........................ C23C 16/32; C23C 16/26
[52] U.S. Cl. .................................... 427/249; 427/255; 427/255.1; 427/419.7
[58] Field of Search ............... 427/249, 299, 301, 255, 427/255.1, 419.7; 428/408, 698

[56] References Cited

U.S. PATENT DOCUMENTS

| | | | |
|---|---|---|---|
| 3,924,034 | 12/1975 | Olcott | 427/249 |
| 3,969,130 | 7/1976 | Bokros | 428/408 |
| 4,029,844 | 6/1977 | Olcott | 427/249 |
| 4,315,968 | 2/1982 | Suplinskas et al. | 427/249 |
| 4,766,013 | 8/1988 | Warren | 427/249 |

FOREIGN PATENT DOCUMENTS 59-59976  4/1984  Japan ................................. 427/249

OTHER PUBLICATIONS

Veltri et al, J. Am. Ceram. Soc. 72(3), 1989, p. 478.

*Primary Examiner*—Shrive Beck
*Assistant Examiner*—Margaret Bueker
*Attorney, Agent, or Firm*—Charles E. Sohl

[57] ABSTRACT

Chemical vapor deposition (CVD) techniques for forming tough silicon carbide (SiC) matrix composites. The introduction of methyldichlorosilane (MDS) to a reactor containing a fiber preform which been flushed with a noble gas, causes the formation of a carbon layer around the fibers. The carbon interlayer improves the fracture toughness of the composite.

5 Claims, 4 Drawing Sheets

500 X

500 X

CVD SIC MATRIX COMPOSITES CONTAINING CARBON COATED FIBERS

TECHNICAL FIELD

This invention relates to the formation of CVD ceramic composites, and specifically to the process of forming a carbon interlayer between the SiC matrix and the fibers within the composite.

BACKGROUND ART

The need for high temperature materials spurred the development of fiber reinforcing ceramic composites, a now known technique of improving the mechanical properties of ceramic materials. Some of the processes used to create such composites include: (1) pressing powder into a fiber preform, and (2) heating to a form a low viscosity glass, pressing, then crystallizing the glass. However, these fabrication techniques present problems such as fiber fracture due to the high pressures, in the former case, and glass flow at high temperature, in the latter case due to the glass remaining because of incomplete crystallization, both of which weaken the composite.

Chemical vapor deposition (CVD—also known as CVI, chemical vapor infiltration when employed to fabricate composites) has been used to form a ceramic matrix within a fiber preform, providing a possible solution to these problems. However, in the CVD process a problem of voids within the composite arises. (U.S. Pat. No. 3,226,194, incorporated herein by reference, describes a chemical vapor deposition process for applying SiC coatings.) Deposition was found to occur at the surface of the fiber preform sealing the surface and making it eventually impermeable to the reactant gases, and therefore inhibiting the formation of a void free matrix within the preform. The use of a temperature gradient, which induces sequential deposition, from the hottest fiber preform surface to the coolest, helps eliminate voids within the matrix.

Another obstacle to be overcome was that of brittle fracture due to the strong bonding between the fibers and the matrix. In order to obtain a desirably weaker fiber-matrix interface, a thin carbon interlayer was implemented. The carbon interlayer allows energy to be absorbed, resulting in crack deflection or blunting as opposed to brittle fracture. One method of obtaining a carbon interlayer consists of precoating the fibers with a thin layer of pyrolytic carbon by infiltrating the fiber preform with propylene under isothermal conditions, under which propylene will decompose, typically at about 1100° C. Once the formation of the carbon layer is complete, the preform is infiltrated with SiC to form the matrix. ("Fiber-Reinforced SiC Composites with Improved Mechanical Properties", Am. Cerm. Soc. Bull., 66[2] 368(1987)). However, the carbon layer thus formed is difficult to control (thickness) and often too thick.

An objective of this invention is to improve the fracture toughness of a ceramic composite using a single operation to introduce a SiC matrix and a carbon interlayer to a fiber preform.

DISCLOSURE OF INVENTION

The present invention comprises a method of forming a SiC matrix and a carbon interlayer within a fiber preform in a single operation. A fiber preform is placed in a reactor whose environment is maintained at a low pressure. While the fiber preform is heated, creating a thermal gradient across it, the reactor is flushed with a noble gas. MDS (methyldichlorosilane) is introduced to the reactor as a saturated vapor via a carrier gas, and an initial layer of carbon forms around the fibers, followed by deposition of SiC. SiC deposition occurs from the hot surface to the cooler surface of the fiber preform. The formation of the carbon layer appears to result from the initial high concentration of noble gas within the system. The carbon interlayer increases the fracture toughness of the composite.

The foregoing and other features and advantages of the present invention will become more apparent from the following description and accompanying drawings.

BEST MODE FOR CARRYING OUT THE INVENTION

Figure 1A:
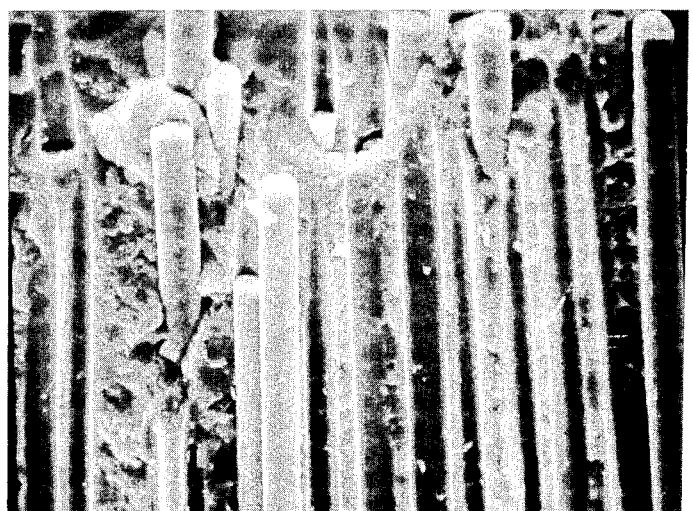
FIG. 1A shows the fracture surfaces of 1723 glass matrix/Nextel TM 480 fiber composites with a carbon interlayer.
Figure 1B:
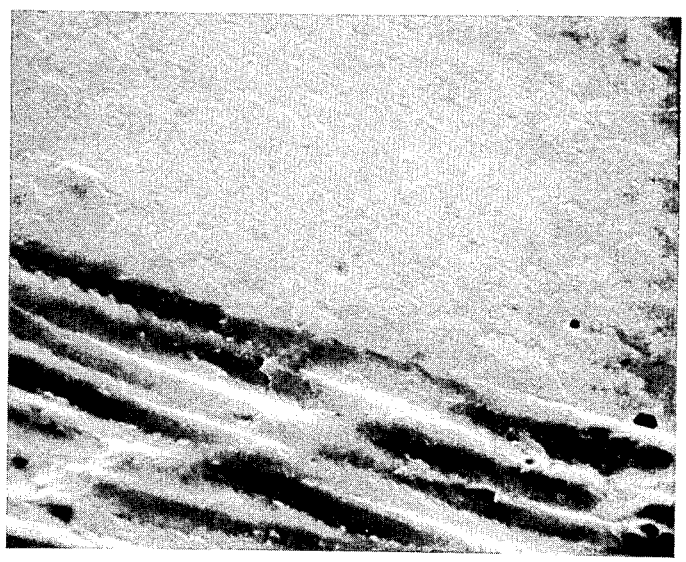
FIG. 1B shows the fracture surfaces of 1723 glass matrix/Nextel 480 fiber composites without a carbon interlayer.

The provision of a thin carbon interlayer between the fibers and the SiC matrix eliminates brittle fracture; a major obstacle in the optimization of fracture toughness in CVD SiC composites. A carbon interlayer prevents strong bonding between the fibers and the matrix, enabling energy to be absorbed thru crack deflection or blunting, resulting in fiber pullout upon fracture. FIGS. 1A and 1B show the results of fracture tests for a glass matrix composite with coated fibers (FIG. 1A), and for a glass matrix composite without coated fibers (FIG. 1B). The uncoated fiber composite has a virtually smooth brittle fracture surface (FIG. 1B), while the coated fiber composite (FIG. 1A) has significant fiber pullout (indicating toughness) in the fracture surface.

Various fibers can be used in this process, such as Nextel, a mullite fiber produced by 3M Co., St. Paul, Minn., and Nicalon, a SiC yarn produced by Nippon Carbon Co., Tokyo, Japan. Nicalon has been found particularly suitable for this application.

MDS has proven to be a particularly suitable reactant gas for deposition of SiC due to its high vapor pressure (B.P.=41.5° C.). Note, MTS (methyltrichlorosilane) may be used. However, MTS has a lower vapor pressure (B.P.=66.4° C.) which can pose a condensation problem in the reactor inlet pipe. The reactant gas is carried into the reactor in its saturated form via a carrier gas; in this instance, hydrogen (H$_2$) at a ratio of approximately 1:3 respectively.

Prior to the introduction of the reactant gas, the reactor is heated to form a thermal gradient across the fiber preform, and flushed with a noble gas. When the MDS is introduced to the system, the noble gas interferes with the initial SiC deposition, causing the formation of a carbon layer, and a carbon/SiC mixed interface between the carbon and SiC. Argon (Ar) has proven suitable for this application.

Figure 2:
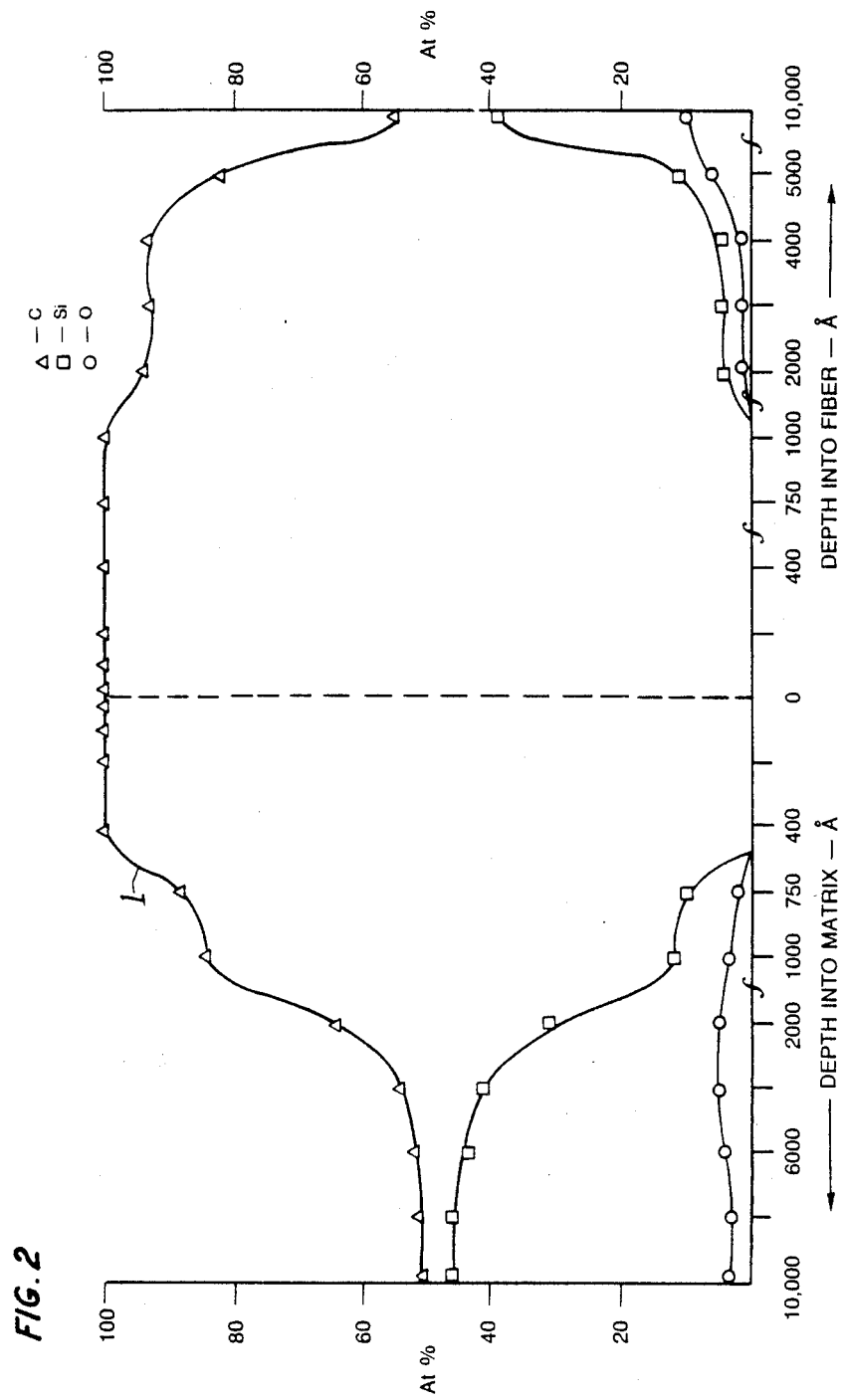
FIG. 2 is a scanning Auger depth profile of the interfacial chemistry of a CVD SiC/Nicalon TM SiC fiber composite prepared using an Ar flush.
Figure 3:
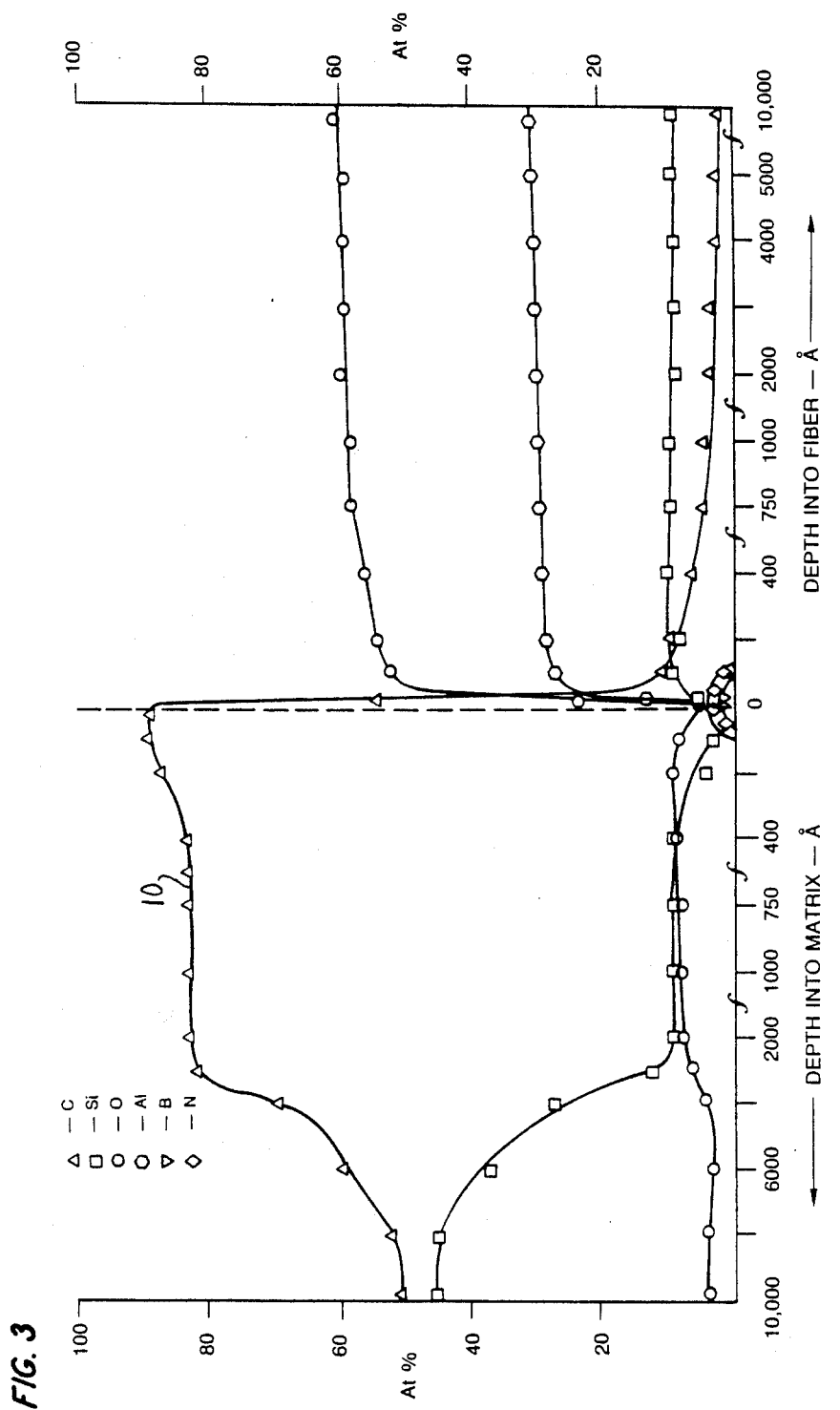
FIG. 3 is a scanning Auger depth profile of the interfacial chemistry of a CVD SiC/Nextel TM 440 fiber composite prepared using an Ar flush.
Figure 4:
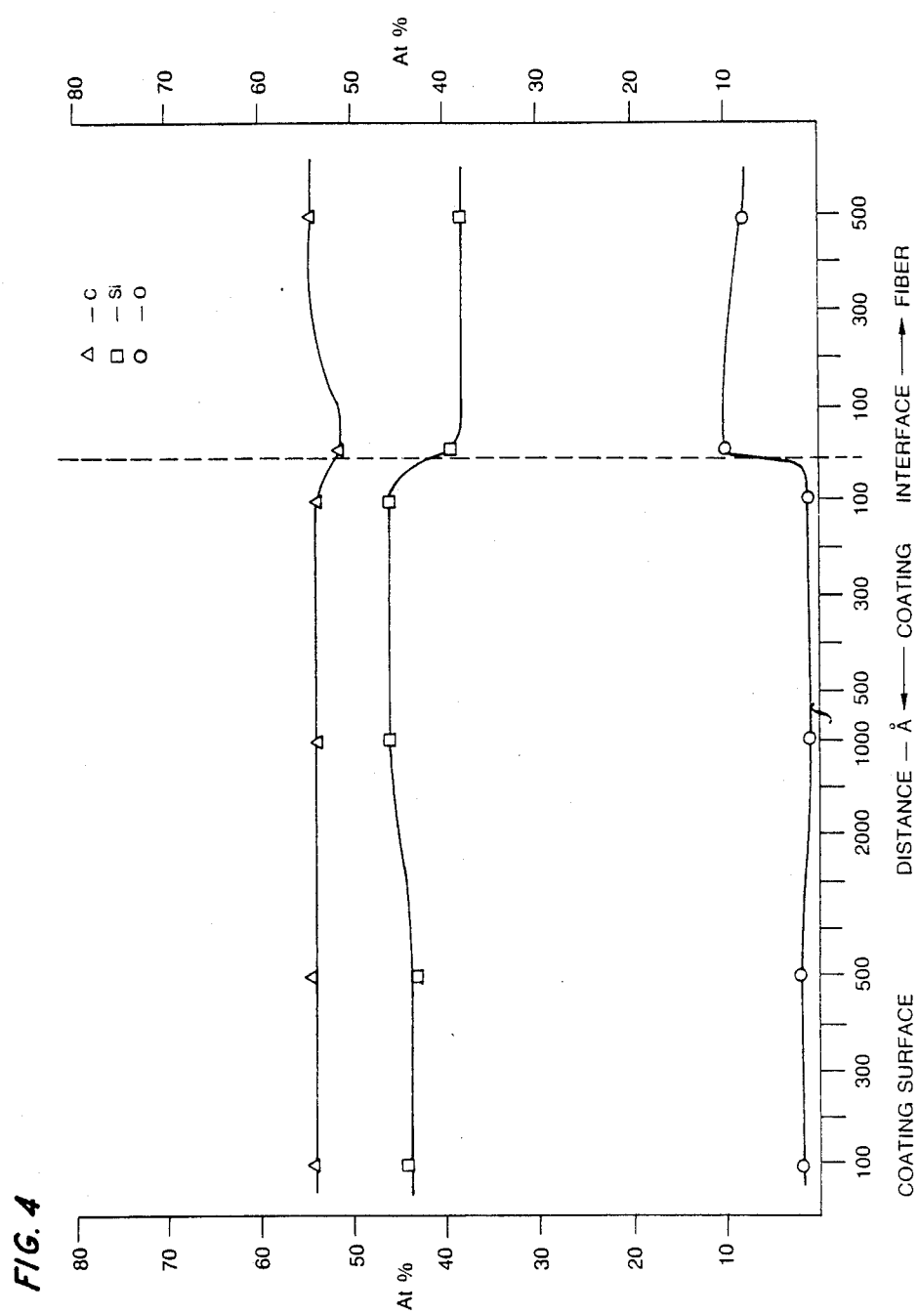
FIG. 4 is a scanning Auger depth profile of the interfacial chemistry of a CVD SiC/Nicalon SiC fiber composite prepared using a H$_2$ flush (prior art).

FIGS. 2 and 3 show scanning Auger depth profiles of composites prepared using an Ar flush with Nicalon fibers and Nextel 440 fibers, respectively. The profile reveals a fairly thick carbon interlayer at the fiber/matrix interface. FIG. 4, an Auger profile of a composite made using a $H_2$ flush as opposed to Ar, shows no evidence of the desired carbon interlayer at the fiber/matrix interface.

The SiC then deposits progressively from the hottest surface of the fiber preform to the coolest, due to the thermal gradient. This sequential deposition aids in the elimination of possible voids within the matrix.

This invention will be clarified by references to the following illustrative examples.

EXAMPLE 1

The following procedure can be used to prepare a SiC matrix/Nicalon composite with a carbon interlayer.

1. A ATJ graphite mandrel/susceptor, 3.75 cm diameter by 12.5 cm long, wound with Nicalon fiber, is loaded into a horizontal flow reactor, 5.7 cm diameter by 38.0 cm long.
2. The flow reactor is evacuated and a pressure below atmospheric pressure is maintained while 1600 cm$^3$/min of argon is flowed through the reactor until the introduction of MDS.
3. The graphite mandrel is inductively heated to 1080° C., creating a thermal gradient across the fiber preform between the graphite mandrel and the water jacket, whose temperature never exceeds approximately 35° C., and an intervening gas layer.
4. The system is baked out for 15 minutes.
5. The MDS and $H_2$ mixture is admitted into the reactor through a metering valve at a constant 65.4 cm$^3$/min flow rate, 15.4 cm$^3$/min MDS and 50.0 cm$^3$/min $H_2$, while simultaneously halting the flow of argon and holding the evaporator at 150 kPa and the condenser at 11° C.
6. The run time totals 100 hours using 6 to 8 hour impregnation process cycles. These cycles are based on an average work day, process step numbers 2-6 are repeated daily until the total desired run time is complete.

FIG. 2 shows the scanning Auger depth profile of the tests results run under the above conditions. Curve 1 clearly reveals the presence of a thick (approximately 6000Å carbon interlayer at the fiber/matrix interface.

EXAMPLE 2

The specifications set forth in Ex. 1 are followed, while substituting Nextel 440 plain weave cloth for Nicalon fiber (step 1).

FIG. 3 shows the scanning Auger depth profile of the test results for example 2. Curve 10 reveals the presence of a carbon interlayer of approximately 3000Å at the fiber/matrix interface.

Although this invention has been shown and described with respect to detailed embodiments thereof, it will be understood by those skilled in the art that various changes in form and detail thereof may be made without departing from the spirit and scope of the claimed invention.

We claim:

1. A method for producing a composite article, said article composed essentially of carbon coated fibers in a SiC matrix, using a CVD reactor assembly, said assembly having means for introducing a noble gas, a reactant gas selected from the group consisting of methyltrichlorosilane (MTS) and methyldichlorosilane (MTS) and a carrier gas, means for establishing a thermal gradient, and means for maintaining a low pressure gas environment, which comprises the steps of:
   a. placing an essentially fiber preform into the reactor;
   b. establishing and maintaining a low pressure gas environment within the reactor;
   c. establishing a thermal gradient across the fiber preform;
   d. flushing the reactor with a noble gas prior to the introduction of the a reactant gas selected from the group consisting of methyltrichlorosilane (MTS) and methyldichlorosilane (MDS) and the carrier gas;
   e. introducing the silane based reactant gas to the reactor on the carrier gas at a ratio of approximately 1:3 and simultaneously halting the flow of the noble gas;

whereby the noble gas induces the formation of a carbon interlayer between the fibers and the SiC matrix upon the introduction of the reactant gas and the carrier gas to the reactor system.

2. A method as in claim 1 using argon as the noble gas.

3. A method as in claim 1 using hydrogen as the carrier gas.

4. An improved method of coating fibers to be embedded within a matrix, of the type wherein the fibers are placed within a CVD reactor assembly using methyldichlorosilane (MDS) as the reactant gas and hydrogen ($H_2$) as a carrier gas, the improvement comprises flushing the reactor with a noble gas prior to the admission of MDS/$H_2$ and simultaneous halting of the flow of noble gas; whereby the noble gas flush, upon the introduction of the MDS/$H_2$, induces the formation or an initial carbon layer around the fibers followed by subsequent deposition of SiC.

5. A method as in claim 4 using argon as the noble gas.

* * * * *